(12) United States Patent
Wang et al.

(10) Patent No.: US 8,883,636 B2
(45) Date of Patent: Nov. 11, 2014

(54) PROCESS FOR SEMICONDUCTOR CIRCUIT

(75) Inventors: Zih-Song Wang, Hsinchu (TW);
Shu-Cheng Lin, Taipei (TW);
Yoshikazu Miyawaki, Hsinchu (TW)

(73) Assignee: Powerchip Technology Corporation, Hsinchu Science Park, Hsinchu (TW)

( * ) Notice: Subject to any disclaimer, the term of this patent is extended or adjusted under 35 U.S.C. 154(b) by 136 days.

(21) Appl. No.: 13/612,725

(22) Filed: Sep. 12, 2012

(65) Prior Publication Data
US 2013/0260557 A1 Oct. 3, 2013

(30) Foreign Application Priority Data
Mar. 29, 2012 (TW) .............................. 101111140 A

(51) Int. Cl.
*H01L 21/28* (2006.01)
(52) U.S. Cl.
USPC .................................. 438/669; 257/E21.158
(58) Field of Classification Search
None
See application file for complete search history.

(56) References Cited

U.S. PATENT DOCUMENTS

| | | | |
|---|---|---|---|
| 2006/0204859 A1* | 9/2006 | Leidy et al. ....................... | 430/5 |
| 2010/0136790 A1* | 6/2010 | Chang et al. ................... | 438/694 |
| 2011/0318931 A1* | 12/2011 | Min et al. ....................... | 438/696 |
| 2012/0043646 A1* | 2/2012 | Kim .............................. | 257/618 |

* cited by examiner

*Primary Examiner* — Alexander Ghyka
*Assistant Examiner* — Stanetta Isaac
(74) *Attorney, Agent, or Firm* — Winston Hsu; Scott Margo

(57) ABSTRACT

A semiconductor process for forming specific pattern features comprising the steps of forming a target layer, a hard mask layer and a plurality of equally spaced-apart core bodies on a substrate, forming spacers on sidewalls of the core bodies, removing the core bodies so that the spacers are spaced-apart on the hard mask layer, using spacers as a mask to pattern the hard mask layer, removing the hard mask bodies outside of a predetermined region, forming photoresists on several outermost hard mask bodies of the predetermined region, and using the photoresists and remaining hard mask bodies as a mask to pattern the target layer.

8 Claims, 12 Drawing Sheets

PROCESS FOR SEMICONDUCTOR CIRCUIT

BACKGROUND OF THE INVENTION

1. Field of the Invention

The present invention relates generally to a semiconductor structure and a process of making the same, and more particularly, to a NAND flash circuit structure and a process of making the same.

2. Description of the Prior Art

The principle of a photolithographic process is to transfer a circuit pattern on a mask to a wafer by a method of exposure and development, thereby producing specific circuit patterns on the wafer. However, with the trend towards scaling down the semiconductor products, the conventional photolithographic technologies face formidable challenges. Takes mainstream ArF excimer laser method with wavelength of 193 nm for example, the reachable minimum half-pitch of a transistor device produced by this kind of light source during exposure in the photolithographic process is 65 nm. By incorporating the well-known immersion lithography technology, the reachable half-pitch may be further reduced to 45 nm, which is almost the physical limitation in the photolithographic processes. For this reason, if the half-pitch of the semiconductor device need to go under 45 nm, the industry needs to utilize more advanced photo-lithographic technologies, such as a double patterning technology, an extreme ultra violet (EUV) technology, a maskless photolithography (ML2) technology or a nano-imprint technology, etc.

Double patterning is one of most mature method within the aforementioned various advanced photolithography technologies. The double patterning technology enables the use of current available photolithographic tools to produce desired finer circuit patterns, without the requirement of purchasing extremely expensive advanced photolithography tools, thereby avoiding huge investments. As the double patterning technology and relevant equipments gradually mature in the industry, the 193 nm immersion lithography technology once limited by the physical limits can be further applied to the advanced process nodes of 32 nm, or even 22 nm, thereby becoming the mainstream photolithographic technology for the next semiconductor generation.

The principle of the double patterning technology is to separate one compact semiconductor circuit pattern into two alternative or complementary circuit patterns. The two separate patterns will be transferred respectively by the photolithographic process and then be combined on one wafer to obtain the final completed circuit pattern. The use of double patterning technology in nowadays NAND flash processes can produce word lines or bit lines with intervals smaller than 28 nm, thereby significantly improving the memory capacity in memory blocks.

With regard to the application of conventional self-aligned double patterning technology in the manufacture of the NAND flash memory, especially in the manufacture of word lines and select gates in the string area, since the widths of circuit features and/or the intervals therebetween are scaled down to dozens of nanometer, the micro-loading effect resulting from the different densities of the circuit features in the processes may be significantly amplified, so that it is difficult to form the pattern features with good profile characteristics, such as critical dimension uniformity (CDU), line width roughness and line edge roughness, etc, in both the open areas and the dense areas of the circuit pattern. To solve this problem, the common solution in the industry is to dispose additional dummy patterns, ex. dummy word lines, at the boundary between dense regions and open regions, such as the boundary between word line patterns and select gate patterns in a string area. The dummy patterns may serve as a sacrificial structure to replace the non-uniformed circuit features formed by using conventional double patterning method, so that the patterns other than the dummy patterns in the layout may have uniform circuit profiles and characteristics.

Although the method of using dummy patterns may solve the problem of non-uniform circuit profiles, it will require more layout space for disposing these dummy patterns. Therefore, this conventional method inherently goes against the principle of increased circuit density in nowadays semiconductor layout designs. Accordingly, it is still necessary for the semiconductor industry to improve the current conventional double patterning technology.

SUMMARY OF THE INVENTION

To overcome the above-mentioned drawbacks in prior art, a novel semiconductor process is provided in the present invention. The process of the present invention pertains to an improved positive self-aligned double patterning (P-SADP) process in semiconductor technology which can form a plurality of line features with uniform profiles in a string area of a memory circuit layout, without requiring any additional dummy line patterns in the circuit layout as the method in prior art. The steps of the present invention are specifically designed to provide more process margin to the photolithographic process.

The object of the present invention is a semiconductor process for forming special pattern features, comprising the steps of sequentially forming a target layer, a hard mask layer and a plurality of equally spaced-apart core bodies on a substrate, forming spacers on sidewalls of the core bodies, removing the core bodies so that the spacers are spaced-apart on the hard mask layer, using the spacers as a mask to pattern the hard mask layer into a plurality of spaced-apart hard mask bodies, removing the core bodies outside of a first predetermined region, covering first photoresists respectively on several outermost hard mask bodies within the first predetermined region; and using the first photoresists and remaining hard mask bodies as a mask to pattern the target layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles.

In the drawings.

Figure 1:
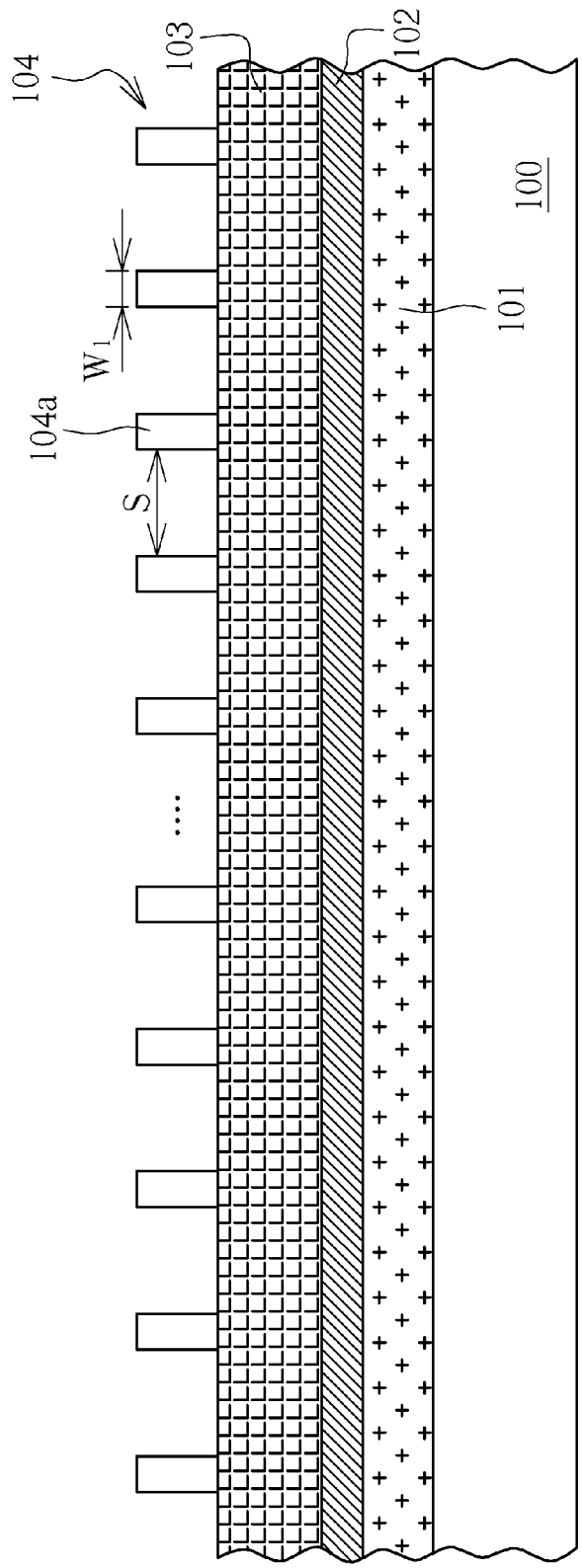
FIGS. 1-11 are cross-sectional views sequentially illustrating a semiconductor process in accordance with the preferred embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the exemplary embodiment, reference is made to the accompanying drawings, which form a part thereof, and in which are illustrated by way of illustration of specific embodiments in which the invention may be practiced. These embodiments are described in sufficient details to allow those skilled in the art to practice the invention. It is to be understood that other embodiments may be utilized and structural, logical, or electrical changes may be made without departing from the scope of the present invention. Accordingly, the following detailed description is not to be taken in a limiting sense, and the scope of the present inventions is defined only by the appended claims. Furthermore, certain terms are used throughout the following descriptions and claims to refer to specific components. As one skilled in the art will appreciate, consumer electronic equipment manufacturers may refer to a component by different names, for example, dielectric layer and insulating layer. Besides, it will be understood that, although the terms "first", "second", etc, may be used in the description to describe various elements, components, regions, layers and/or sections, these elements, components, regions, layers, sections and/or the order thereof should not be limited by these terms.

The exemplary embodiments will now be explained with reference to the accompanying drawings to provide a better understanding of the process of the present invention, wherein FIGS. 1-11 are cross-sectional views sequentially illustrating a semiconductor process in accordance with the exemplary embodiment of the present invention. The method of the present invention is an improved approach to the conventional positive self-aligned double patterning (P-SADP) process. The disclosed detailed steps can obtain the line patterns having uniform profiles without the requirement of configuring additional dummy pattern features.

Please now refer to FIG. 1, a substrate 100 is first provided to serve as a base for the semiconductor devices or components in the structure of the exemplary embodiment. A target layer 101, a hard mask layer 102 and a core layer 103 are sequentially formed on the substrate 100. The target layer 101 is configured to be patterned into the components or the conductive circuits of various desired semiconductor devices. In the exemplary embodiment, the target layer 101 is configured to form conductive circuits, such as word lines, bit lines or select gates, etc, in a memory circuit layout. The hard mask layer 102 is patterned into a patterned etching mask in later processes to be used in the formation the conductive circuit in the underlying target layer 101. The core layer 103 is patterned into a plurality of protruding core bodies, or units, on the hard mask layer 102 in later processes, in order to constitute the desired circuit pattern of the present invention. Relevant detailed description will be explained in following embodiment. In the exemplary embodiment, the substrate 100 may include a silicon substrate, a silicon-containing substrate, a GaN-on-silicon (or other material of Group III-V), a graphene-on-silicon substrate or a silicon-on-insulator (SOI) substrate and so on, but not limited to a semiconductor substrate. The concept of the present invention may also be applied to other technical fields, such as the field of display panels. For example, the substrate 100 may be an insulating glass substrate or a quartz substrate. The material of the target layer 101 may include, but not limited to, conductive materials, semiconductor material or insulating materials, such as poly-crystalline silicon, amorphous silicon, salicide, metal material or tetraethoxysilane (TEOS). The material of the hard mask layer 102 may include silicon nitride, silicon oxide, but not limited to insulating materials. A metal material, such as titanium nitride (TiN), may also be adopted. The material of the core layer 103 may include silicon nitride, silicon oxide and polycrystalline silicon, but is not limited thereto. However, the core layer 103 and the hard mask layer 102 must have different etching selectivity. That is, the core layer 103 and the hard mask layer 102 will have different etching rate in the same etching process. Additionally, a multilayer resist (MLR, not shown) may be formed on the core layer 103 to compensate the deviation of proximity effect in later photo-lithographic process.

After forming the core layer 103, please refer again to FIG. 1, a photolithographic process 103 is then performed to form patterned the photoresist layer 104. In the exemplary embodiment of the present invention, the pattern of the photoresist layer 104 includes a plurality of equally spaced-apart line features 104a, such as word lines in a NAND string. The width $W_1$ of line feature 104a may be configured to be the limit value of the exposure capability of the photo-lithographic tool used in the process. For example, using the mainstream ArF excimer laser source with a wavelength of 193 nm may achieve a line width $W_1$ of 65 nm. Preferably, the interval S between the line features 104a is three times the width $W_1$ of the line features. The limit of line width is designated herein as F (i.e. the feature size).

Figure 2:
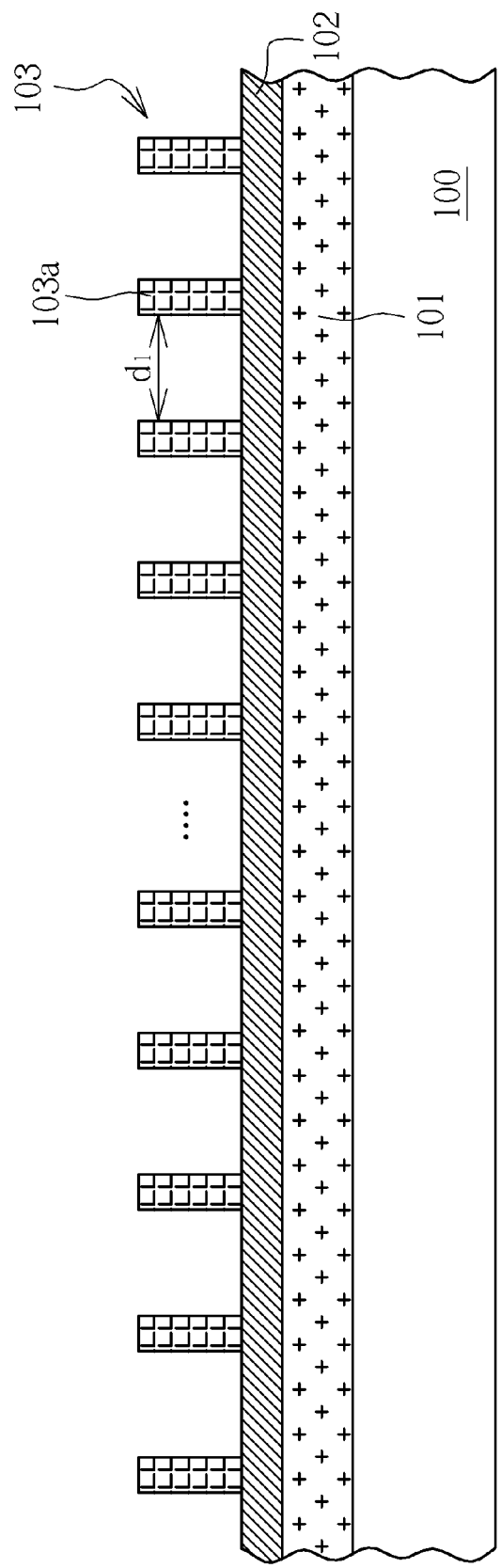

After the patterned photoresist layer 104 is formed, please refer to FIG. 2, an etching process is then performed to pattern the core layer 103. In the exemplary embodiment of the present invention, the core layer 103 is patterned into a plurality of equally spaced-apart core bodies 103a with the same size after the etching process. When observed from the top, the core bodies 103a are arranged in spaced-apart line structure, such as word lines in a NAND string. The aforementioned photolithographic/etching process is a well-known method in the relevant field of technology, thus the redundant description is herein omitted.

In the embodiment, since the entire pattern of the photoresist layer 104 is composed of line features 104a with uniform sizes and densities, the micro-loading effect resulting from the different densities of the pattern features may be significantly relieved both in the step of the aforementioned photolithographic process for forming the line features 104a or in the step of the aforementioned photolithographic process for forming the core bodies 103. Therefore, the core bodies 103a with uniform sizes and profiles are able to be formed on the hard mask layer 102, wherein the core bodies are spaced-apart from each other by the same interval $d_1$. Moreover, a trimming process may be further performed to reduce the width of the core bodies 103a after the core bodies 103a are formed, in order to facilitate the formation of even finer line features in later process.

Figure 3:
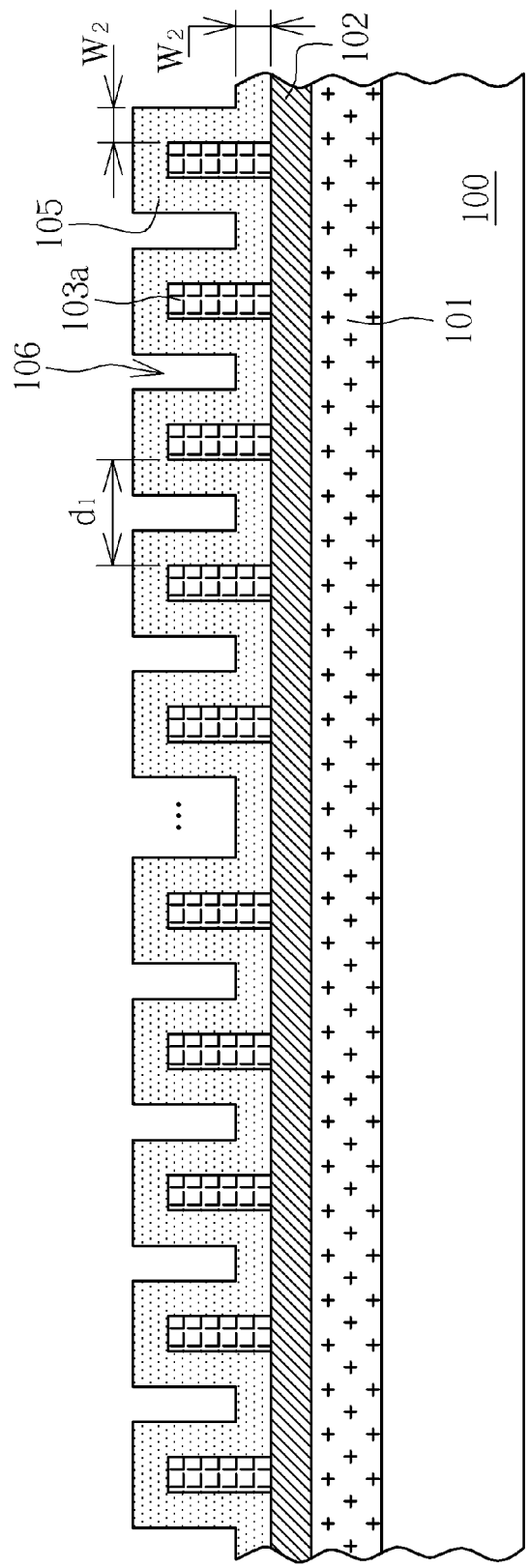

After the core bodies 103a are formed, please refer to FIG. 3, a deposition process is performed on the substrate 100 to form a spacer material layer 105. The spacer material layer 105 is conformally formed on the surfaces of the hard mask layer 102 and the core bodies 103a through, for example, an atomic layer deposition (ALD) process, which may form a layer with an uniform thickness throughout the substrate 100. In this manner, a plurality of recesses 106 may be formed between each core bodies 103a with the spacer material layer 105 deposited thereon. The recesses 106 are separated on the substrate, similar to the arrangement of the core bodies 103a. In the exemplary embodiment of present invention, the material of the spacer material layer 105 may include silicon nitride, silicon oxide and polycrystalline silicon, but is not limited thereto. However, the spacer material layer 105, the core layer 103 and the hard mask layer 102 must have different etching selectivity. That is, the spacer material layer 105, the core layer 103 and the hard mask layer 102 will have different etching rates in the same etching process, in order to remove the core layer (i.e. core bodies) 103 by an anisotropic etching process with specific etching selectivity in later processes.

In the process of present invention, the function of the spacer material layer 105 is to form spacer structure on the core bodies 103a. With regard to the P-SADP process, the thickness $W_2$ of the spacer material layer 105 will be the width of the desired final circuit pattern (ex. word lines). For example, in one exemplary embodiment of present invention, the thickness $W_2$ of deposited spacer material layer 105 is configured to be half the limit value of exposure capability of the photolithographic tool used in the process. For example, in the condition that ArF excimer laser stepper (with an exposure wavelength of 193 nm) is utilized as the photolithographic tool, the limit value of the exposure capability is 56 nm, thus the thickness of the spacer material layer 105 must be configured to have a value of 28 nm. Alternatively, the thickness $W_2$ of spacer material layer 105 may be configured to be one-third of the interval $d_1$ between the core bodies 103a. This configuration may facilitate the formation of equally-spaced and equi-width word lines in later processes as well as providing a sufficient overlay budget for the photolithographic process. Relevant detailed description will be explained in following embodiment.

Figure 4:
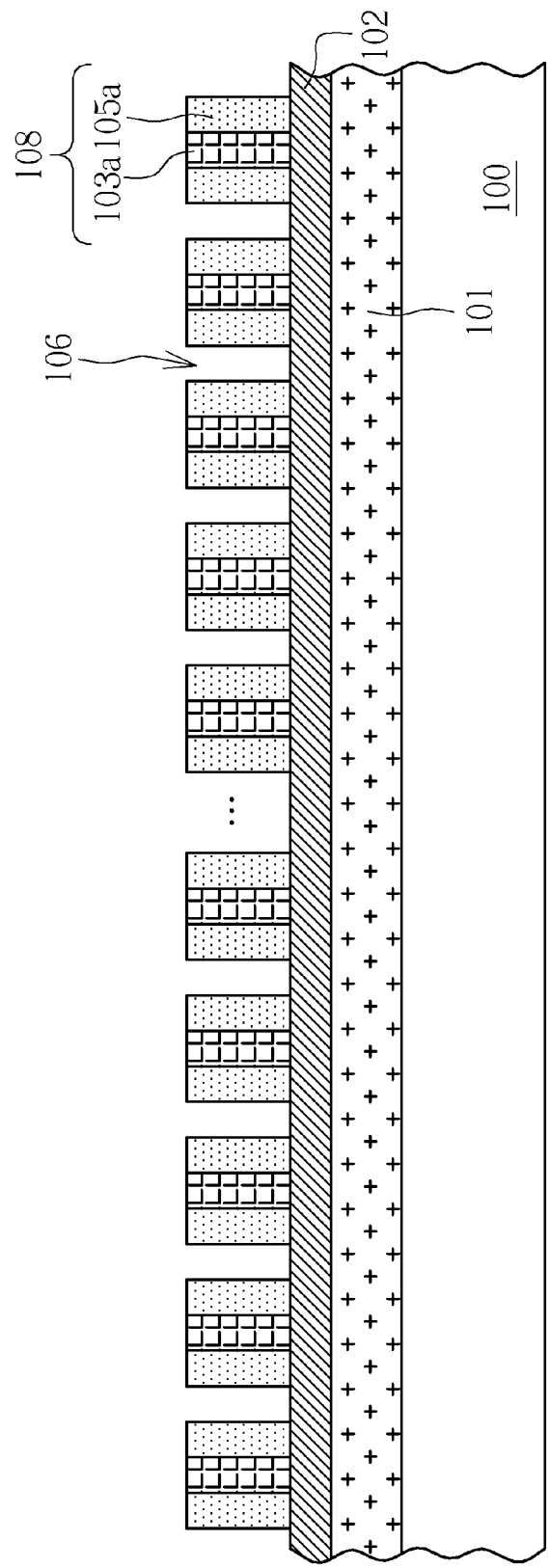

Please now refer to FIG. 4. An anisotropic etching back process is performed to remove parts of the spacer material layer 105. The etching back process will remove parts of the spacer material layer 105 until the top surface of core bodies 103a and the hard mask layer 102 under the recess 106 once covered by the spacer material layer 105 are exposed, thereby forming separated spacers 105a on sidewalls of each core body 103a. One core body 103a and the two spacers 105a on sidewalls thereof define a core structure unit 108, wherein the adjacent core structure units 108 are spaced-apart by recesses 106.

Figure 5:
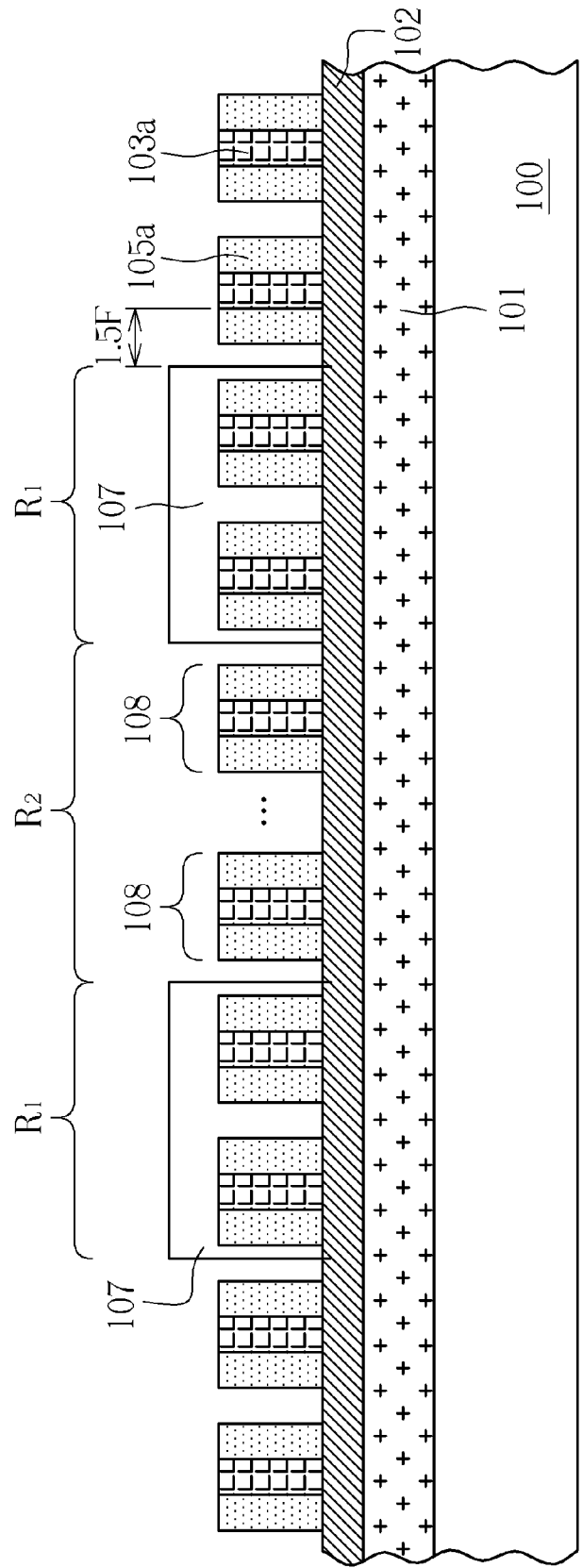

After removing parts of the spacer material layer 105, please refer to FIG. 5, two first predetermined regions $R_1$ are defined on the substrate 100 as predetermined regions for select gates in a string area, while a second predetermined region $R_2$ between the two first predetermined regions $R_1$ serves as a predetermined region for word lines. In a layout of a conventional memory string, the region at both sides of a string unit (ex. the two first predetermined regions $R_1$ in FIG. 5) are respectively provided with a larger select gate structure, and the region between the two select gates (ex. the second predetermined region $R_2$ in FIG. 5) are provided with a plurality of spaced-apart word line structures, wherein the number of word lines is generally $2^n$, for example, 32 or 64. In the exemplary embodiment of present invention, the first predetermined region $R_1$ encompasses several core bodies 103a and the spacers 105a at both sides of said several core bodies 103a. The two first predetermined regions $R_1$ are respectively covered with first photoresists 107 to protect the core bodies 103a therein, in order to form larger select gate structures at both sides of the string area in later processes. As far as this process is concerned, since the distance between the first predetermined region $R_1$ and the nearest core bodies at both sides is larger than 1.5 F (F is the aforementioned limit of line width or the feature size), so the photolithographic process may have a sufficient overlay budget (referred also as overlay shift tolerance) to cover the first photoresists 107 on the predetermined region. Please note that each first photoresist in the exemplary embodiment encompasses two core structure units 108. However, depending on the requirements of the design, each first photoresist 107 may encompass a region including more than two core structure units 108.

Figure 6:
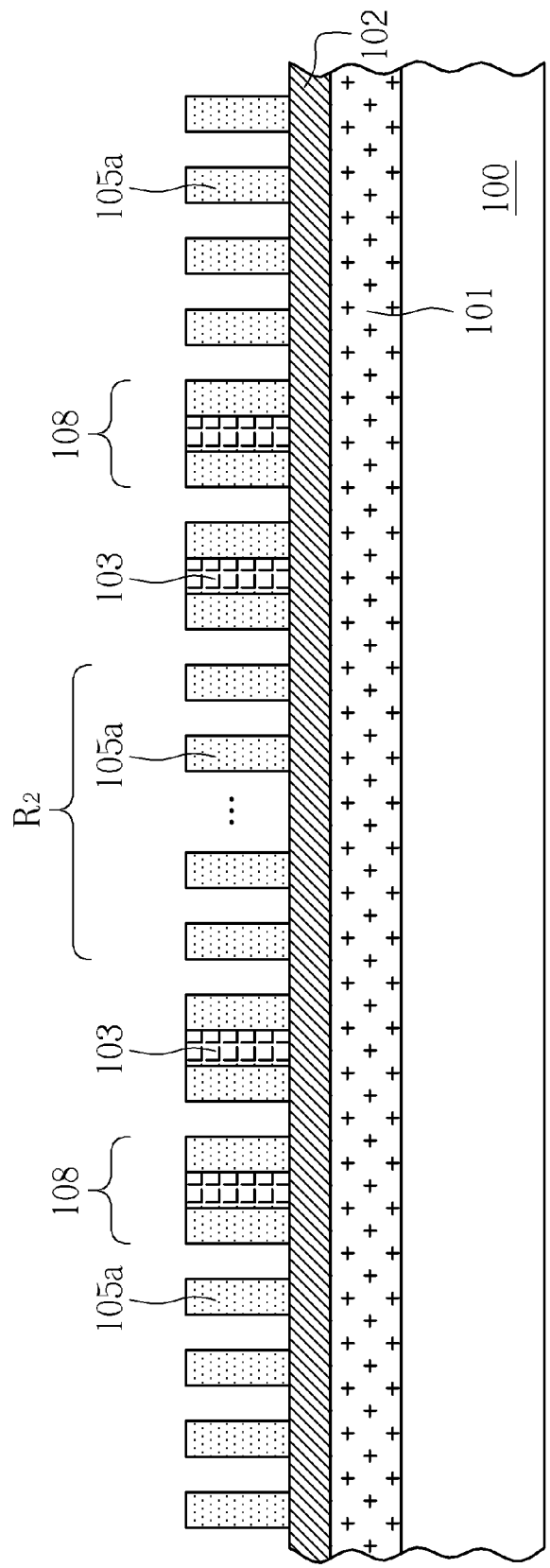

After covering the first photoresist 107 on the first predetermined region $R_1$, please refer to FIG. 6, a selective etching process is performed to remove the core bodies 103a which are not covered by the first photoresists 107. An ashing process is subsequently performed to remove the first photoresists 107 so that a plurality of equally spaced-apart spacer 105a may be formed on the hard mask layer 102, wherein the spacers 105a within the second predetermined $R_2$ constitute a predetermined array pattern for the word lines. Since the core bodies 103a once formed in the first predetermined $R_1$ are covered by the first photoresist 107 during this etching process, the core bodies 103a in the first predetermined $R_1$ are not removed, thus the core structure unit 108 in the first predetermined region $R_1$ which has a size larger than the spacer 105a, may be kept on the substrate. In the exemplary embodiment, the approach of keeping the larger core structure unit 108 in the first predetermined region $R_1$ at both sides will provide a sufficient overlay budget for the photolithographic processes for forming select gates in later process.

Figure 7:
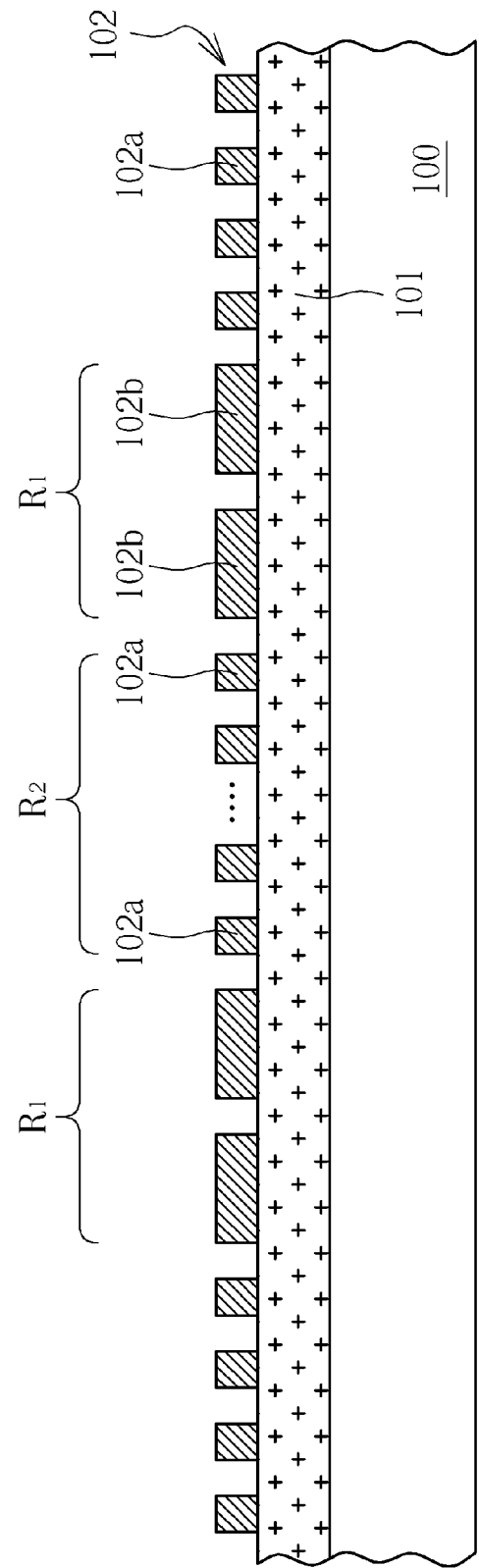

After the exposed core bodies 103a are removed, please refer to FIG. 7, using the newly-formed spacers 105a and the remaining core structure units 108 as a mask to perform an etching process. The etching process may remove the exposed hard mask layer 102, so that the pattern feature including a plurality of spaced-apart spacers 105a in the second predetermined region $R_2$ and two core structure units 108 in the first predetermined region $R_1$ are transferred to the hard mask layer 102. Subsequently, the spacers 105a and core structure units 108 which serve as the etching mask are then removed after the etching process to obtain the pattern structure of the hard mask layer 102 shown in FIG. 7. The patterned hard mask layer 102 may include a plurality of hard mask bodies with different sizes, for example, the small hard mask bodies 102a and the large hard mask bodies 102b shown in FIG. 7. In the embodiment, the adjacent large hard mask bodies 102b in the first predetermined $R_1$ are configured to define one single select gate pattern, while each small hard mask body 102a within the second predetermined region $R_2$ are configured to define one word line pattern.

Figure 8:
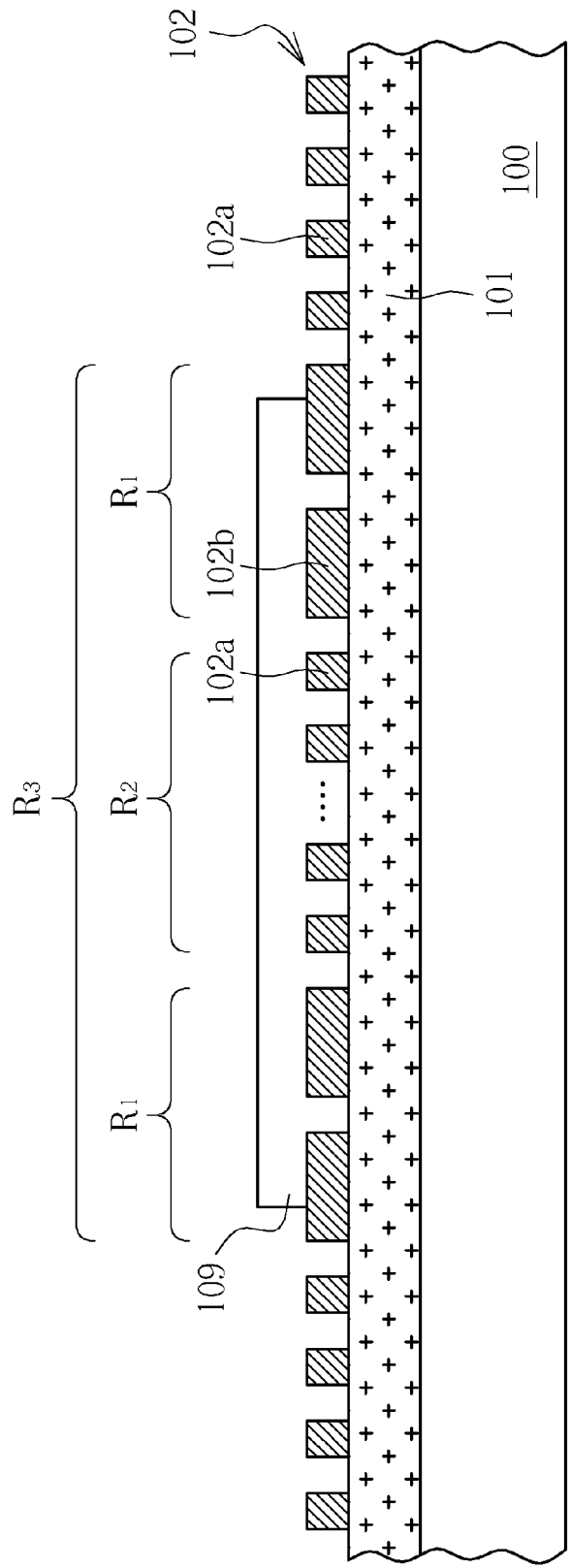
Figure 9:
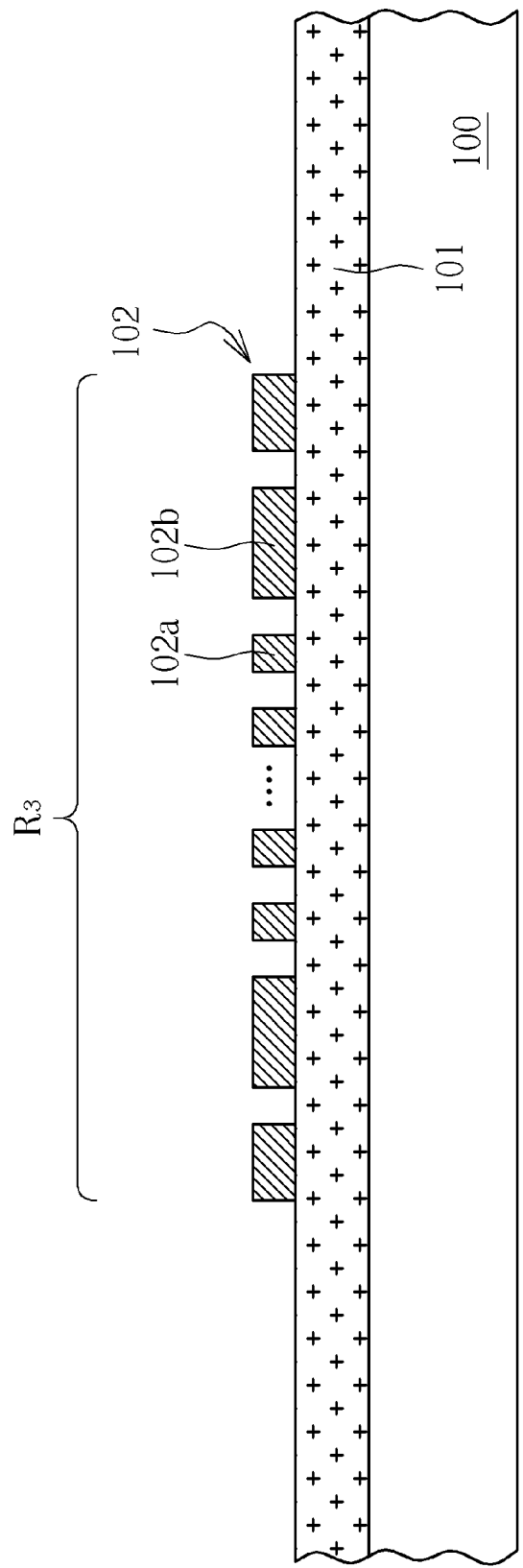

After forming the large and small hard mask bodies, please refer to FIG. 8, a second photoresist 109 is covered on a third predetermined region $R_3$ which substantially encompasses the aforementioned second predetermined region $R_2$ and the first predetermined region $R_1$ at both sides. The area defined by the third predetermined region $R_3$ may be a NAND string area in the layout of a memory circuit, so the third predetermined region R3 may be provided with a plurality of word lines and two select gates at both sides. In the exemplary embodiment, the aforementioned second photoresist 109 formed on the third predetermined region $R_3$ is used as a mask to perform an etching process on the hard mask layer 102, thereby removing the small hard mask bodies 102a outside of the third predetermined region $R_3$. Parts of the edge portion of the large hard mask bodies 102b may also be removed during the etching process. The pattern of the hard mask layer 102 after etching is shown in FIG. 9. After the etching process, all of the hard mask bodies outside of the third predetermined region $R_3$ are removed. In the aforementioned step of covering the second photoresist 109, since the size of large hard mask bodies 102b at both sides of the third predetermined region $R_3$ is larger (ex. 3 F in this embodiment) than the small hard mask bodies 102a, the photoresist 109 is provided with a sufficient overlay budget to be formed within the third predetermined region $R_3$.

At this stage, as shown in FIG. 9, the third predetermined region $R_3$ defines one string area on the target layer 101. The entire target layer 101 may include a plurality of third predetermined regions $R_3$ arranged in array, while FIG. 9 only exemplifies one third predetermined region $R_3$. The rest of the surface of the target layer 101 between each defined third predetermined region $R_3$ may be kept as a predetermined contact hole region in later processes. One essential feature of present invention is: since the small hard mask bodies 102a in the third predetermined region $R_3$ are formed from a plurality of equally spaced-apart line features 104a shown in FIG. 1, the pattern formed in a series of following steps in the process will be less impacted by the micro-loading effect, due to the identical pattern density of the line features 104, so that the small hard mask bodies 102a serving as a final mask for forming the word line array may have uniform circuit properties, such as uniform critical dimension unit (CDU), line width roughness (LWR) and line edge roughness (LER), which is a series of excellent manufacturing processes capable of forming better circuit pattern.

Figure 10:
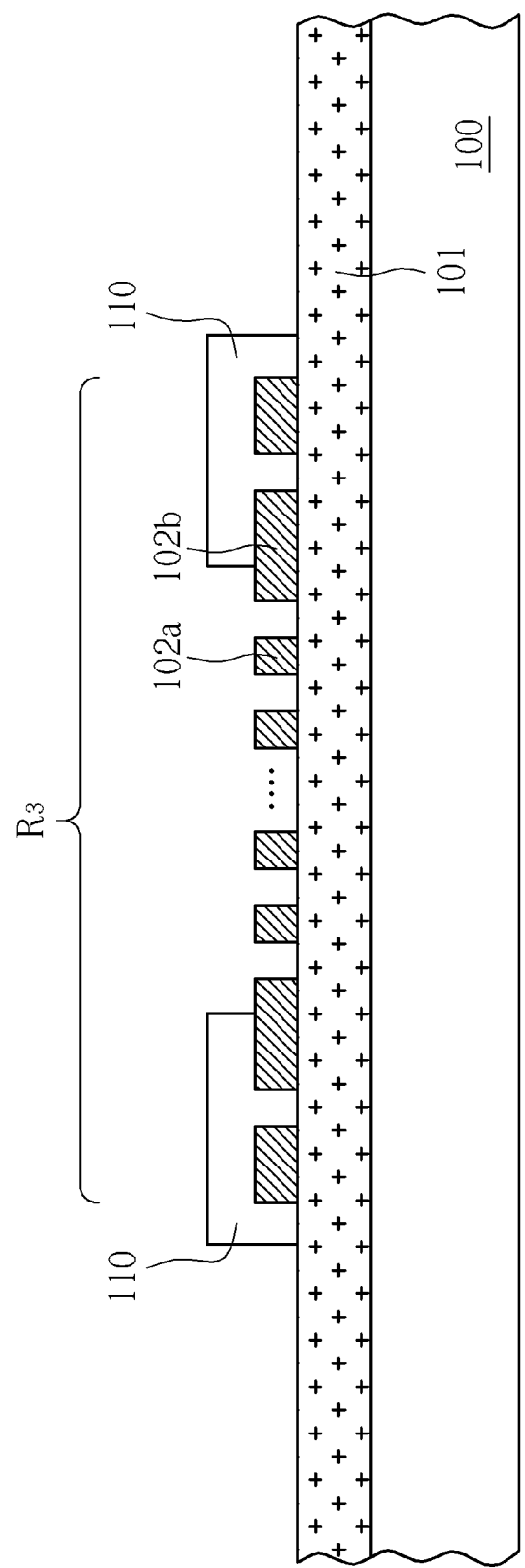

In following process, as shown in FIG. 10, a third photoresist 110 is covered on the large hard mask bodies 102b at both sides of the third predetermined region $R_3$. Each third photoresist 110 may cover a portion of the adjacent large hard mask bodies 102b, so the third photoresist 110 and the covered large hard mask bodies 102b may define the patterns of select gates at both sides. In this manner, the patterns of word lines array in the middle of the string area and the select gates at both sides are, therefore, completed.

Figure 11:
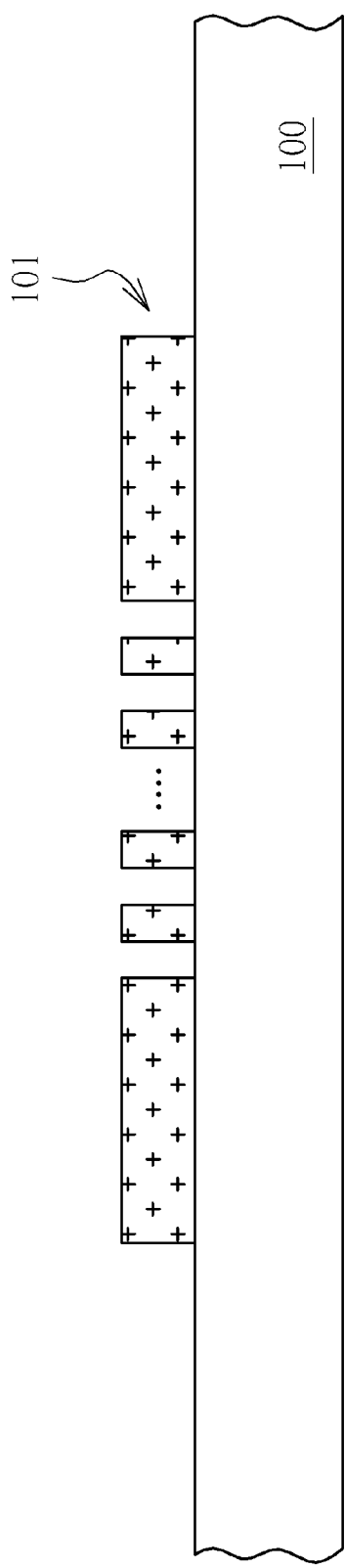

Subsequently, as shown in FIG. 11, the patterns of word line array and select gates defined in the aforementioned step are used as a mask to perform an etching process on the target layer 101, thereby transferring the pattern features of said word lines and select gates to the target layer 102. The third photoresists 110, the small hard mask bodies 102a and the large hard mask bodies 102b used as the mask are then removed after the etching process to obtain the word line array structure and select gates structure in a string area shown in FIG. 11.

As far as the present invention is concerned, the final pattern of the target layer formed by a series of aforementioned process steps will have a word line array with an uniform profile, so that it is unnecessary to dispose one or more sacrificial dummy word lines at the position adjacent to the select gates at both sides in the step of initial definition of the word line pattern, like the method in prior art. Therefore, this method may effectively increase the space for the circuit layout. The efficacy of the process of present invention results from the distinctive characteristics that all of the patterns, including core bodies 103a, spacers 105a, small hard mask bodies 102a and large hard mask bodies 102b in a series of process of present invention, is based on, or derives originally from a plurality of equally spaced-apart line features 104a shown in FIG. 1, thus the uniform pattern density of said line features 104a may significantly relieve the micro-loading effect when manufacturing the nano-scale fine circuit pattern.

Furthermore, for any aforementioned steps with photolithographic process, including the step of forming the first photoresists 107 to protect parts of core bodies 103a shown in FIG. 5, the step of forming the second photoresist 109 to define one string area shown in FIG. 8, and the step of forming the third photoresists 110 to define the select gate patterns shown in FIG. 10, the precisely-planned layout is configured to provide a sufficient overlay budget to the photolithographic processes. This efficacy partially results from the formation of the core structure unit 108 shown in FIG. 6, which can provide a larger coverable area (ex. several F) for the subsequent photolithographic processes.

Figure 12:
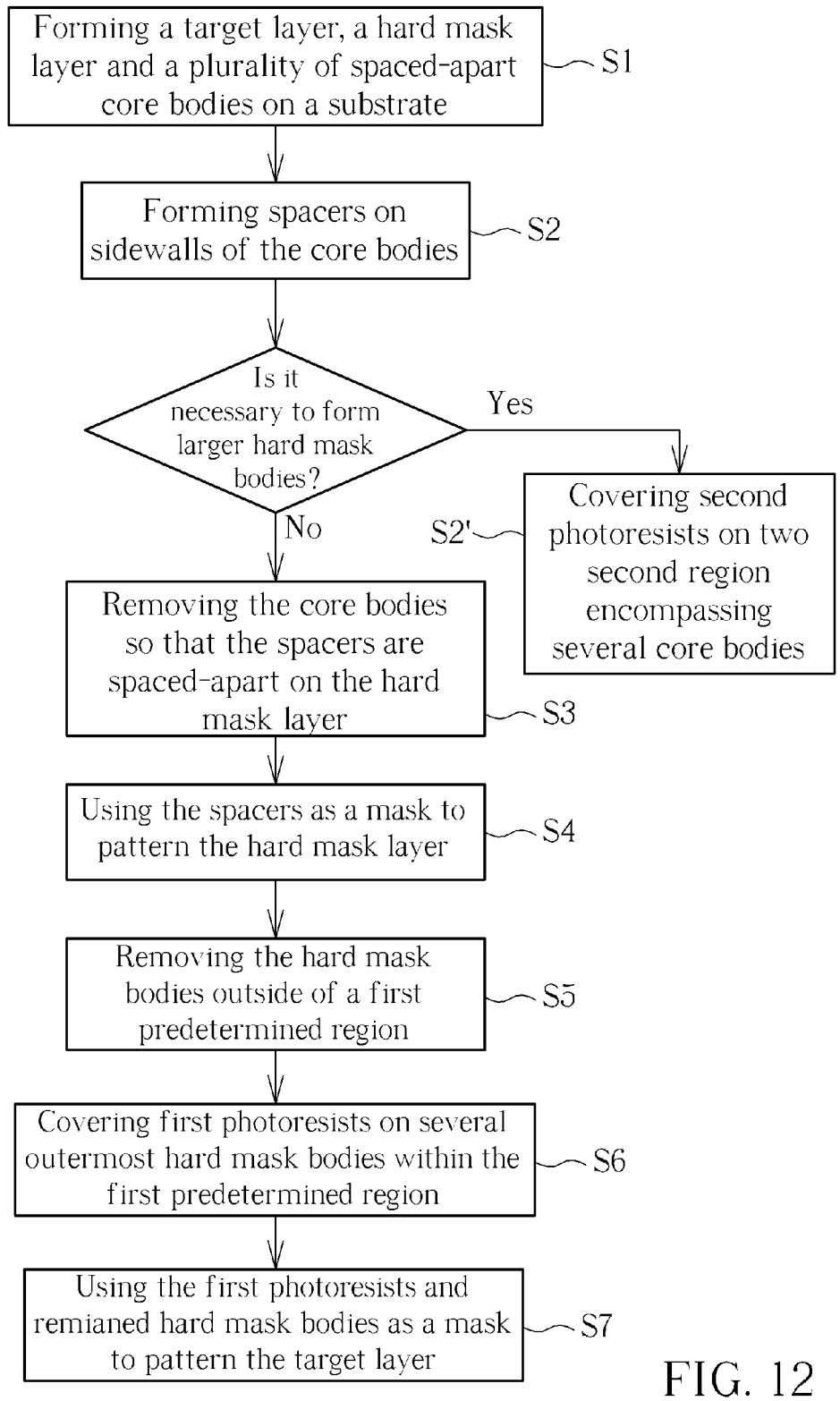
FIG. 12 is a main process flow of the semiconductor process in the present invention.

In conclusion to the aforementioned description, the process flow shown in FIG. 12 summarizes the semiconductor process of the present invention with the steps sequentially including: forming a target layer, a hard mask layer and a plurality of spaced-apart core bodies on a substrate (S1), forming spacer on sidewalls of the core bodies (S2), removing the core bodies so that the spacers are spaced-apart from each other on a hard mask layer (S3), using the spacers as a mask to pattern the hard mask layer into a plurality of hard mask bodies (S4), removing the hard mask bodies outside of a first predetermined region (S5), covering first photoresists on several outermost hard mask bodies at both sides within the first predetermined region (S6), and using the first photoresists and remaining hard mask bodies as a mask to pattern the target layer (S7). In order to provide a sufficient overlay budget to the photolithographic steps in the processes, an additional step S2' may be added to the exemplary process flow after the step S2 of forming the spacers, that forms second photoresists respectively on two second regions encompassing several core bodies. This additional step S2' may produce larger core structure units 108 as shown in FIG. 6 in later processes, thereby further producing larger hard mask bodies 102b as shown in FIG. 10 configured to be covered by the photoresists in step S6.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor process for forming special pattern features, comprising:
    sequentially forming a target layer, a hard mask layer and a plurality of equally spaced-apart core bodies on a substrate having two first predetermined regions and a second predetermined region, wherein said core bodies have the same width and said two first predetermined regions are respectively located at both sides of said second predetermined region;
    forming spacers on sidewalls of said core bodies, wherein adjacent spacers are spaced-apart by a recess;
    forming first photoresists respectively on said two first predetermined regions encompassing several said core bodies;
    removing said core bodies not covered by said first photoresists so that said spacers in said second predetermined region are spaced-apart on said hard mask layer;
    using said spacers and said remained core bodies as a mask to pattern said hard mask layer into a plurality of spaced-apart large and small hard mask bodies, wherein said hard mask bodies in said two first predetermined regions are larger than said hard mask bodies in said second predetermined region;
    forming second photoresists respectively on said two first predetermined regions covering said hard mask bodies; and
    using said second photoresists and said hard mask bodies as a mask to pattern said target layer.

2. The semiconductor process for forming special pattern features according to claim 1, after patterning said hard mask layer into a plurality of spaced-apart hard mask bodies, further comprising a step of removing said hard mask bodies outside of said two first predetermined regions and said second predetermined region.

3. The semiconductor process for forming special pattern features according to claim 1, wherein said small hard mask bodies in said second predetermined regions are word line patterns.

4. The semiconductor process for forming special pattern features according to claim 3, wherein the number of said small hard mask bodies in said second predetermined regions is $2^n$, wherein n is a positive integer larger than 5.

5. The semiconductor process for forming special pattern features according to claim 1, wherein said second photoresists and said hard mask bodies covered by said second photoresists constitute select gate patterns.

6. The semiconductor process for forming special pattern features according to claim 1, wherein the step of forming said spacers on the sidewalls of said core bodies further comprises conformally forming a spacer material layer on said hard mask layers and said core bodies, so that a plurality of recesses are formed on said spacer material layer, and each said recess is formed between two adjacent said core bodies.

7. The semiconductor process for forming special pattern features according to claim 6, wherein the step of forming said spacers on the sidewalls of said core bodies further comprises removing parts of said spacer material layer to expose top surfaces of said core bodies and said hard mask layer under said recesses.

8. The semiconductor process for forming special pattern features according to claim 1, wherein said semiconductor process is a positive self-aligned double patterning process.

* * * * *